United States Patent [19]
Takasugi

[11] Patent Number: 5,287,327
[45] Date of Patent: Feb. 15, 1994

[54] SYNCHRONOUS DYNAMIC RANDOM ACCESS MEMORY

[75] Inventor: Atsushi Takasugi, Tokyo, Japan

[73] Assignee: Oki Electric Industry Co., Ltd., Tokyo, Japan

[21] Appl. No.: 791,388

[22] Filed: Nov. 14, 1991

[30] Foreign Application Priority Data

Nov. 20, 1990 [JP] Japan ................. 2-316523

[51] Int. Cl.$^5$ .................................... G11C 8/04
[52] U.S. Cl. ................. 365/230.02; 365/189.05; 365/230.08; 365/233.5
[58] Field of Search ........ 365/230.02, 230.08, 365/233.5, 189.05

[56] References Cited

U.S. PATENT DOCUMENTS

| | | | |
|---|---|---|---|
| 4,128,900 | 12/1978 | Lappington | 365/189.05 |
| 4,661,928 | 4/1987 | Yasuoka | 365/233.5 |
| 4,928,268 | 5/1990 | Higuchi et al. | 365/189.05 |
| 4,985,868 | 1/1991 | Nakano et al. | 365/230.08 |
| 5,077,693 | 12/1991 | Hardee et al. | 365/230.08 |
| 5,083,296 | 1/1992 | Hara et al. | 365/230.08 |

FOREIGN PATENT DOCUMENTS

| | | |
|---|---|---|
| 0051910 | 5/1982 | European Pat. Off. . |
| 0280882 | 9/1988 | European Pat. Off. . |
| 0322901 | 7/1989 | European Pat. Off. . |
| 56-044919 | 4/1981 | Japan . |
| 39295 | 2/1986 | Japan . |
| 275384 | 11/1987 | Japan . |
| 72394 | 3/1989 | Japan . |

OTHER PUBLICATIONS

IBM Technical Disclosure Bulletin, vol. 31, No. 8, Jan., 1989, pp. 47-49, "Method Providing Wait-State Processor Cycles Using Medium Speed Dynamic RAM".

Primary Examiner—Eugene R. LaRoche
Assistant Examiner—Tan Nguyen
Attorney, Agent, or Firm—Spencer, Frank & Schneider

[57] ABSTRACT

A synchronous dynamic random-access memory provides data output in response to multiplexed address signals, a first control signal, a second control signal, and a clock signal, includes a memory cell array having a plurality of memory cells. Address input circuitry latches the address signals on a first transition of the clock signal selected by the first control signal to generate an X-address, and on a second transition of the clock signal selected by the second control signal to generate a Y-address. Decoding circuitry coupled to the memory cell array and the address input circuitry selects one or more memory cells in the memory cell array according to the X-address and the Y-address. Output circuitry coupled to the memory cell array outputs data from the memory cells in synchronization with the clock signal.

25 Claims, 15 Drawing Sheets

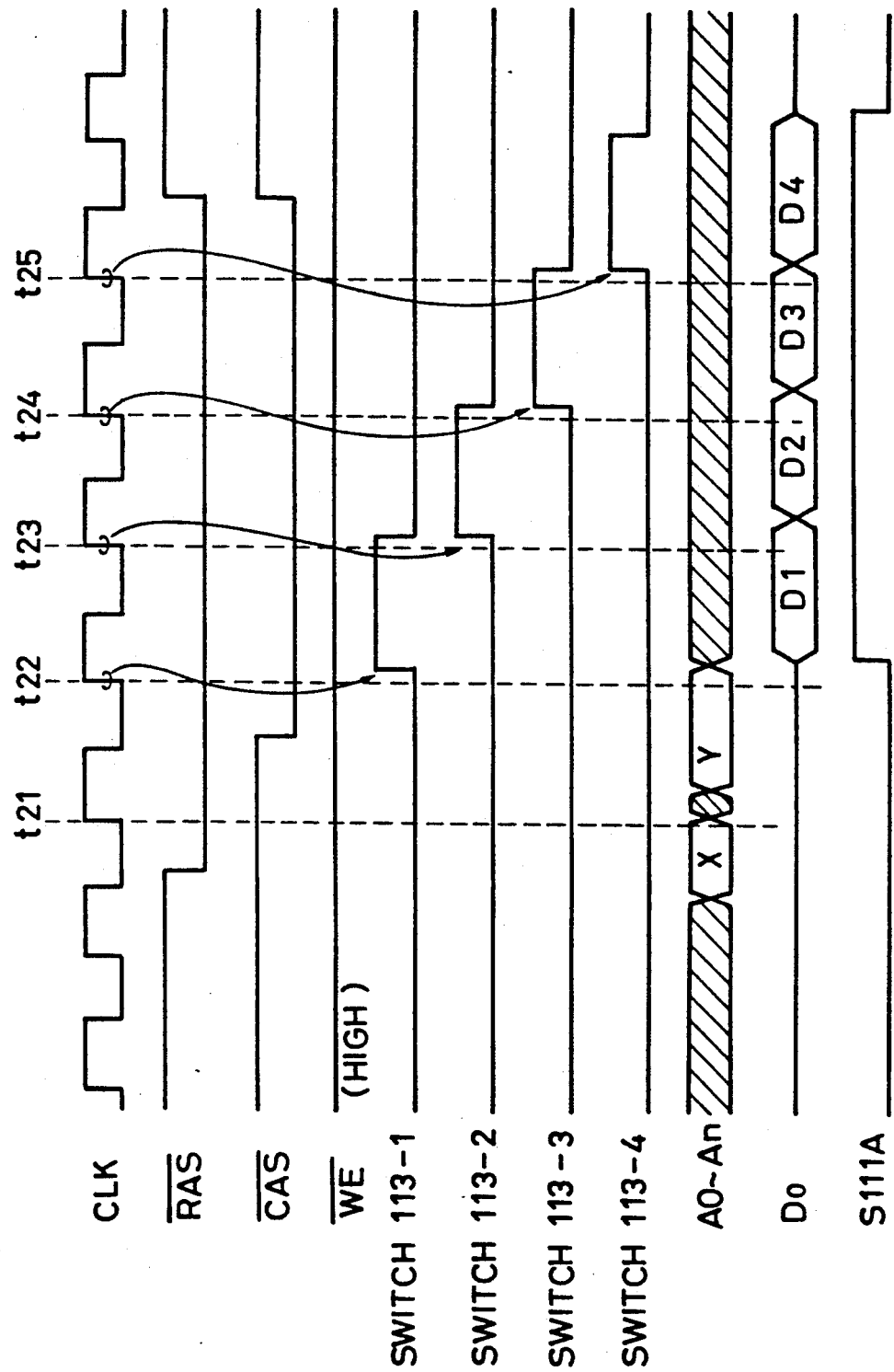

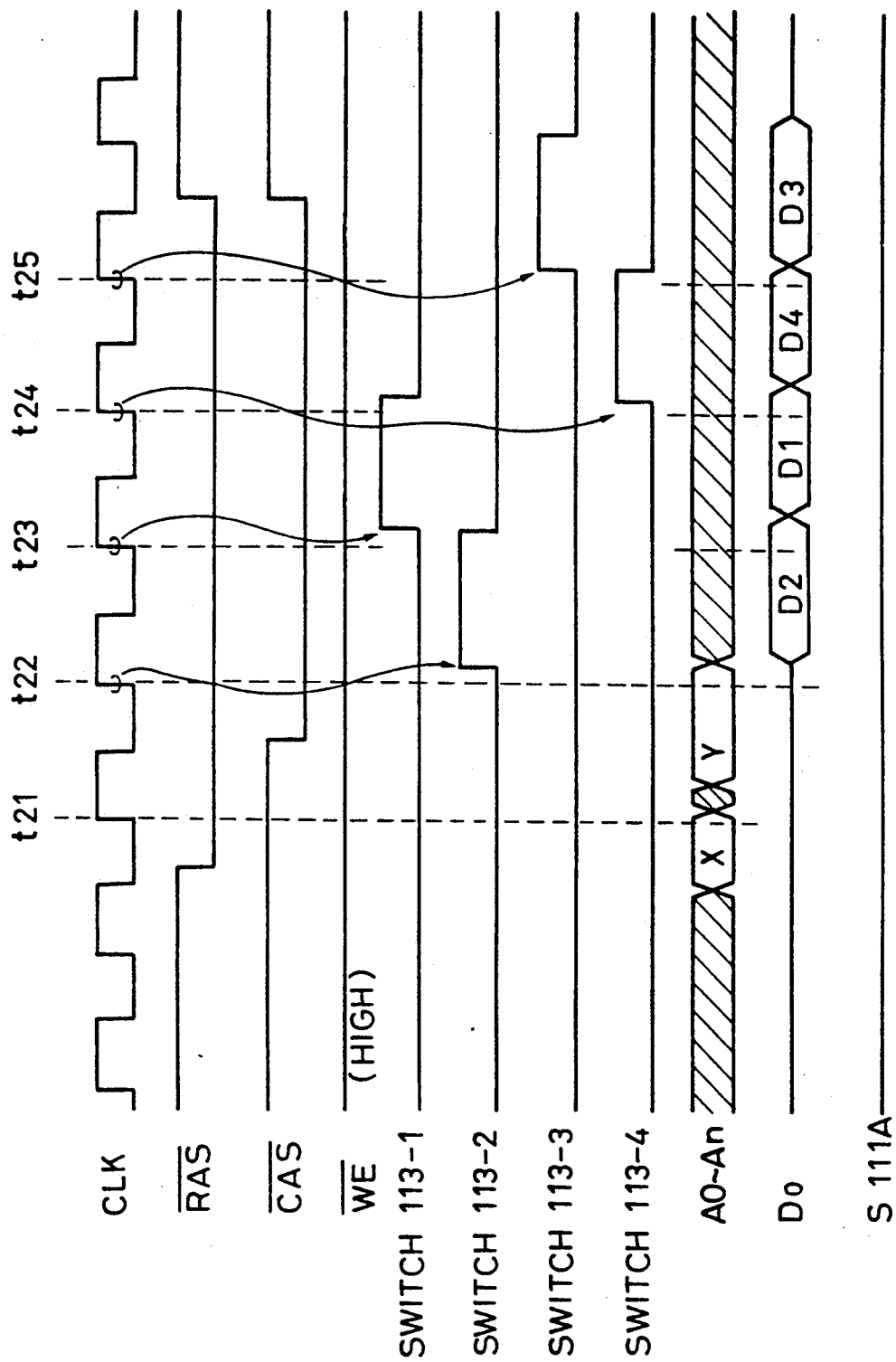

SYNCHRONOUS DYNAMIC RANDOM ACCESS MEMORY

BACKGROUND OF THE INVENTION

This invention relates to a dynamic random-access memory (DRAM) that operates in synchronization with a clock signal, thus being suitable for integration into microcontrollers and application-specific integrated circuits.

A microcontroller, for example, generally comprises a central processing unit, read-only memory, random-access memory, and other modules integrated onto a single semiconductor chip. Operations of all on-chip circuits are synchronized by a system clock signal. In the past, the random-access memory has generally been of the static type (SRAM), which has a simple control scheme permitting rapid access and can easily be synchronized to the system clock. For many purposes it would be desirable to use DRAM, which takes up less space and dissipates less power than SRAM, but the more complex control required by DRAM has been an obstacle.

In prior-art DRAM, the timing of address input and data output is determined by a plurality of control signals. Even if these control signals are generated by the central processing unit in synchronization with the system clock, because of unavoidable fabrication variations in circuit elements, synchronization between the system clock and DRAM input and output operations will be inaccurate. Inaccurate synchronization must be allowed for by employing a low clock frequency, which of course limits the speed of the entire device.

SUMMARY OF THE INVENTION

It is accordingly an object of the present invention to synchronize DRAM address input accurately to a clock signal.

Another object of the invention is to synchronize DRAM data output accurately to a clock signal.

Yet another object of the invention is to output data in a single clock cycle selected in relation to a first control signal.

Still another object is to enable data output to be extended for additional clock cycles responsive to a second control signal.

A further object is to enable data from different memory cells to be output in consecutive clock cycles.

A still further object is to enable the order of data output in consecutive clock cycles to be altered according to certain address bits.

A synchronous dynamic random-access memory has address input means for latching an address signal on a first transition of a clock signal to generate an X-address, and on a second transition of the clock signal to generate a Y-address. The first transition is selected by a first control signal; the second transition is selected by a second control signal. A decoding means selects one or more memory cells in a memory cell array according to the X-address and Y-address. An output means outputs data from the selected memory cells in synchronization with the clock signal.

According to one aspect of the invention, the output means comprises a data latch means, tri-state output means, and output control means. Data read from the memory cell array are held in the data latch means, and output by the tri-state output means in response to an output control signal from the output control means. The output control means activates the output control signal for one or more clock cycles, starting a certain number of clock cycles after activation of the first control signal.

According to another aspect of the invention, the output means comprises a multiple data latch means, a tri-state output means, and a consecutive output control means. The multiple data latch means latches and holds data read from a plurality of memory cells in the memory cell array. The consecutive output control means receives one or more address bits from the address input means, selects the data held in the multiple data latch means in an order determined from these one or more address bits, and supplies the selected data to the tri-state output means for external output.

BRIEF DESCRIPTION OF THE DRAWINGS

FIG. 14 is a timing diagram for FIG. 13.

FIG. 15 is a timing diagram for FIG. 13.

DETAILED DESCRIPTION OF THE INVENTION

A more detailed description of the invention will be given with reference to the drawings. These drawings are shown as illustrations of the invention but they do not restrict its scope as set forth in the appended claims.

Figure 1:
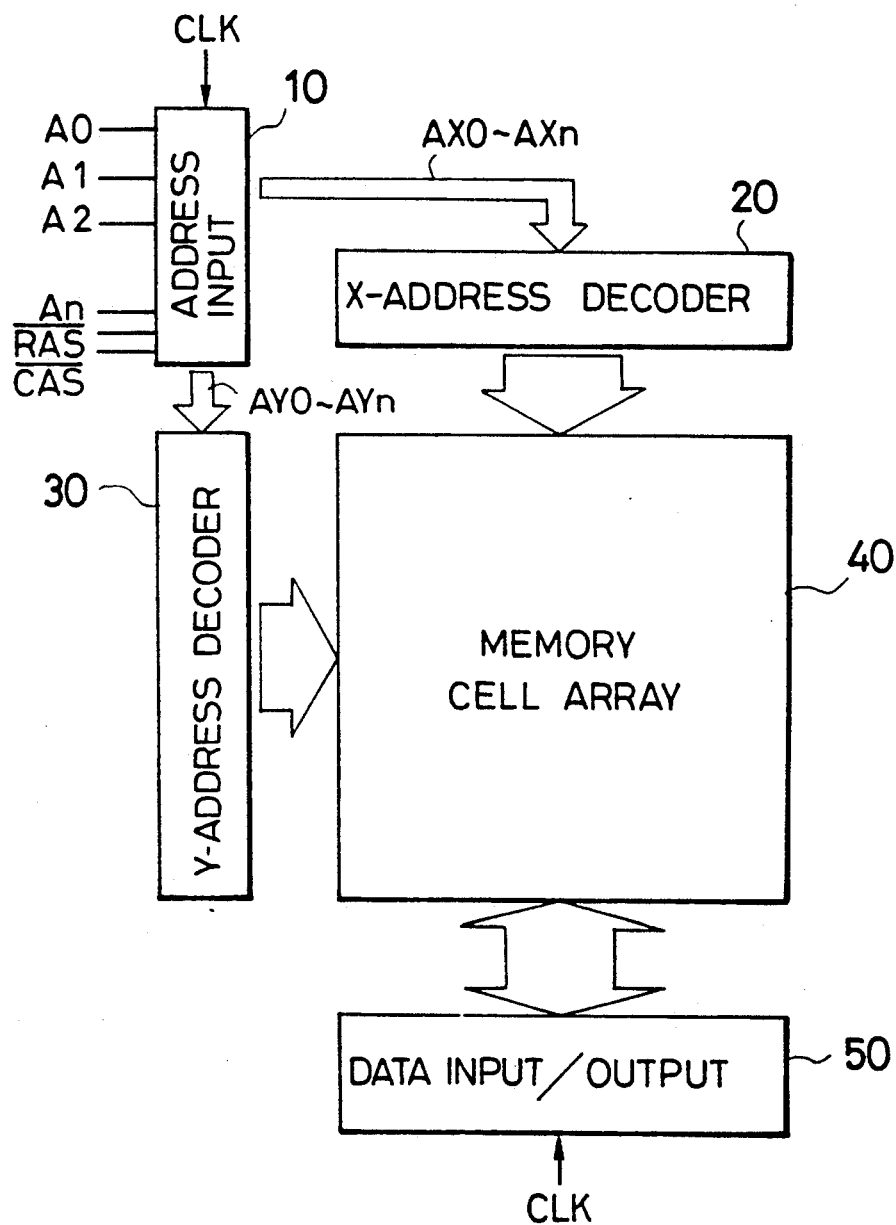
FIG. 1 is a block diagram of a synchronous DRAM.

Referring to FIG. 1, the invented memory comprises an address input circuit 10 that receives n+1 address signals A0–An (n is a positive integer), a clock signal (CLK), a first control signal (conventionally designated $\overline{RAS}$: row address strobe), and a second control signal ($\overline{CAS}$: column address strobe). Address input is multiplexed: both a row address (X-address) and column address (Y-address) are input on the same signal lines A0–An. The address input circuit latches the address signals on a first transition of CLK selected by $\overline{RAS}$, the latched address becoming an X-address (AX0–AXn), then latches the address signals again on a second transition of CLK selected by $\overline{CAS}$, the address latched this time becoming a Y-address (AY0–AYn).

The X-address is supplied to an X-address decoder 20 and the Y-address to a Y-address decoder 30. These address decoding means decode the X-address and Y-address to select one or more memory cells in a memory cell array 40. A data input/output means 50 transfers data between the selected memory cell or cells and an external data bus (not shown) thereby either reading data out of the memory cells or writing data into the memory cells. Data output is synchronized with CLK.

Figure 2:
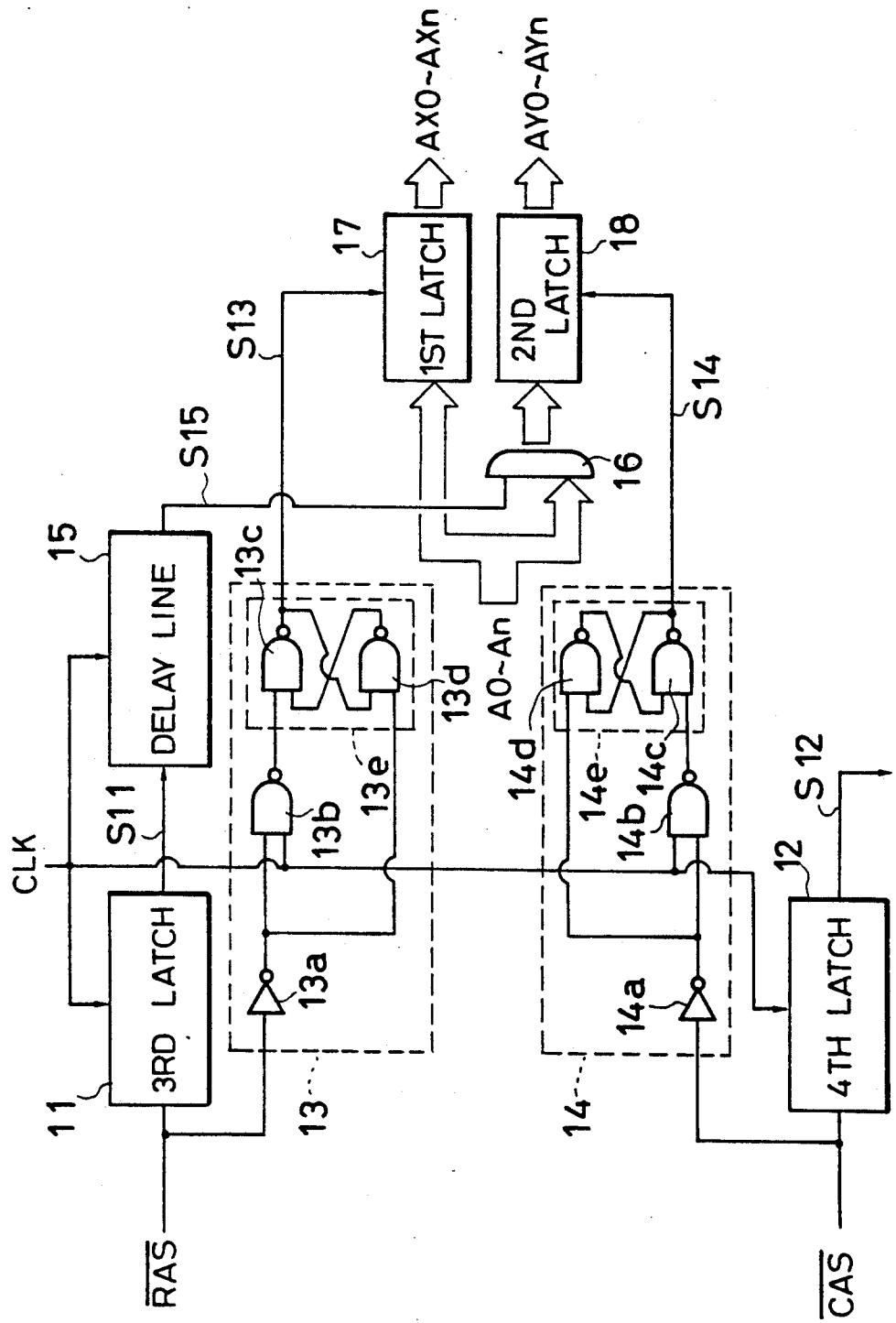
FIG. 2 is a schematic diagram of a novel address input circuit.

FIG. 2 is a schematic diagram of the address input circuit 10 in FIG. 1. The address signals A0–An are supplied to a first transparent latch circuit 17 and a second transparent latch circuit 18. The address input circuit also has a third transparent latch circuit 11 for latching $\overline{RAS}$, and a fourth transparent latch circuit 12 for latching $\overline{CAS}$.

A transparent latch circuit is controlled by an enable signal, being transparent to its input when the enable signal is in a first state, latching its input when the enable signal changes to a second state, and continuing to output the latched value until the enable signal reverts to the first state. In FIG. 2 the first transparent latch circuit 17 is controlled by an X-address latch signal S13, the second transparent latch circuit 18 is controlled by a Y-address latch signal S14, and the third and fourth transparent latch circuits 11 and 12 are controlled by CLK. Specifically, the first transparent latch circuit 17 is enabled or made transparent when the X-address latch signal S13 is low, and latches the address signals A0–An upon low-to-high transition of the X-address latch signal S13. The second transparent latch circuit 18 is made transparent when the Y-address latch signal S14 is low, and latches the address signals A0–An via an input gate 16 upon low-to-high transition of the Y-address latch signal S14. The third and fourth transparent latch circuits 11 and 12 are made transparent when CLK is Low and latch the $\overline{RAS}$ or $\overline{CAS}$, respectively upon low-to-high transition of CLK.

The X-address latch signal S13 is output by an X-address latch signal generating circuit 13 comprising an inverter 13a that inverts $\overline{RAS}$, a NAND gate 13b that performs the NOT AND logic operation on the output of the inverter 13a and CLK, and a set-reset flip-flop 13e comprising NAND gates 13c and 13d. The set-reset flip-flop 13e is set by the output of the NAND gate 13b and reset by the output of the inverter 13a; it therefore sets when $\overline{RAS}$ is low and CLK is high, and resets when $\overline{RAS}$ goes high. The X-address latch signal S13 is the output of the NAND gate 13c.

The operation of the X-address latch signal generating circuit 13 is evident from the schematic. S13 is inactive (low) whenever $\overline{RAS}$ is inactive (high). If $\overline{RAS}$ becomes active (low) while CLK is low, at first there is no change in S13, but as soon as CLK goes high, the set-reset flip-flop 13e sets and S13 becomes active (high). Thereafter, S13 remains active (high) until $\overline{RAS}$ becomes inactive (high) again.

The Y-address latch signal S14 is output by a Y-address latch signal generating circuit 14 similar in structure and operation to the X-address latch signal generating circuit 13, having an inverter 14a, a NAND gate 14b, and a set-reset flip-flop circuit 14e comprising NAND gates 14c, and 14d. The Y-address latch signal S14 is inactive (low) whenever $\overline{CAS}$ is inactive (high), becomes active (high) when $\overline{CAS}$ is active (low) and CLK is high, and remains active until $\overline{CAS}$ becomes inactive (high) again.

To avoid unwanted changes in the output of the second transparent latch 18, this address input circuit also has a delay line 15 and a Y-address input gate 16. The delay line 15 comprises, for example, a D-type flip-flop that delays the output of the first transparent latch circuit 11 by a certain amount responsive to CLK, also inverting the output of the third transparent latch 11, thus producing a signal S15 that becomes active (high) at a certain transition of CLK after $\overline{RAS}$ has become active (low). The Y-address input gate 16 performs an AND logic operation on S15 and each of the address bits A0–An, thus feeding the address signals A0–An to the second transparent latch circuit 18 when S15 is active and blocking the address signals A0–An when S15 is inactive.

Figure 3:
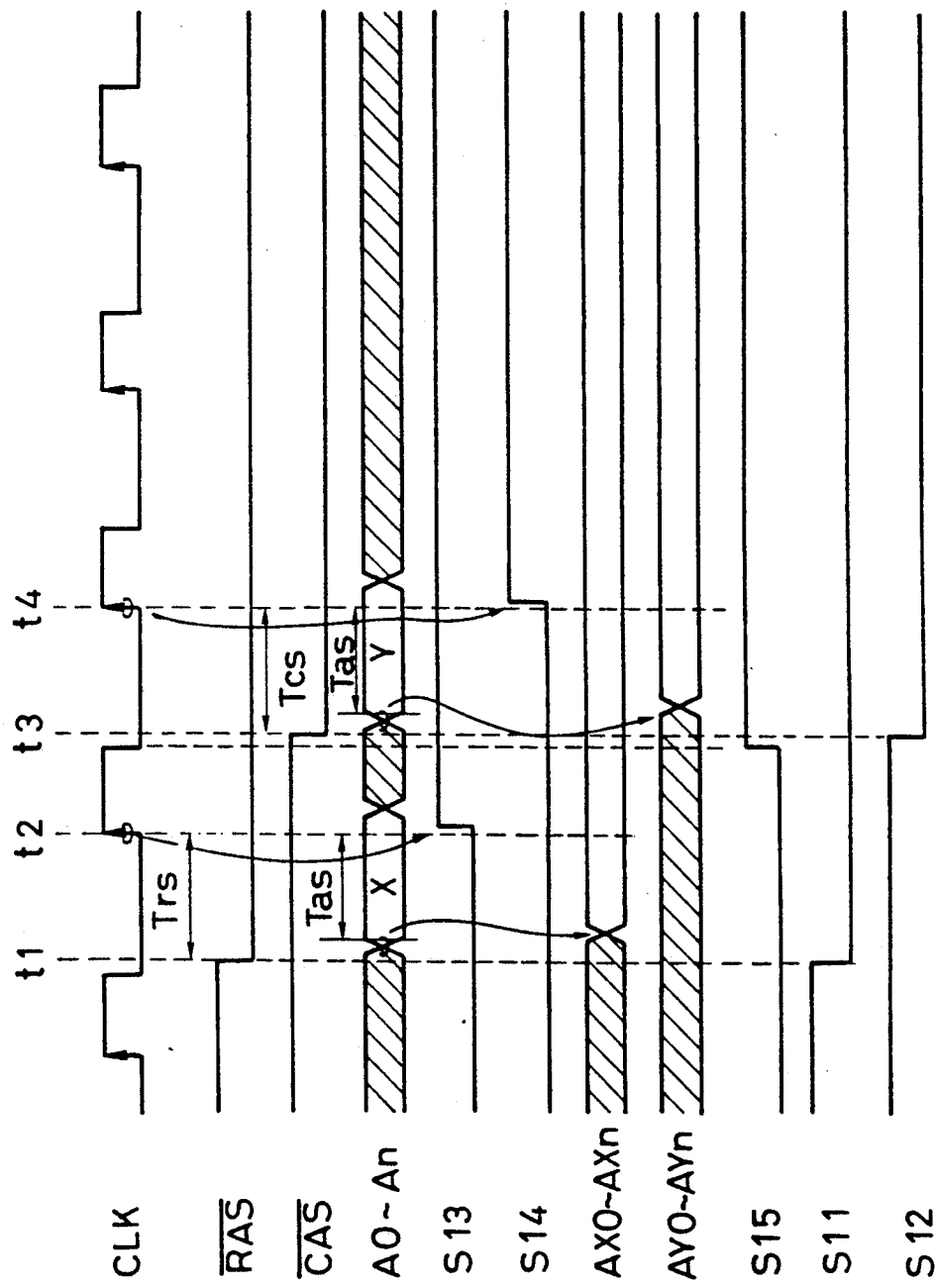
FIG. 3 is a timing diagram for FIG. 2.

The operation of FIG. 2 will be explained with reference to FIG. 3, which is a timing diagram for FIG. 2. Cross-hatching in FIG. 3 indicates the don't-care state.

$\overline{RAS}$ is driven active (low) by an external device such as a central processing unit at a time t1 after the fall of CLK, allowing a certain setup time Trs with respect to the next low-to-high transition of CLK. At about the same time, the central processing unit outputs an X-address on the address signal lines A0–An. As soon as it becomes valid, this address is passed through the first transparent latch circuit 17 to the X-address decoder 20 as the X-address AX0–AXn. Since the Y-address input gate 16 is closed, this address is not passed to the second transparent latch 18 or the Y-address decoder 30.

At time t2 CLK goes high, the X-address latch signal S13 rises, and the first transparent latch circuit 17 closes. The first transparent latch circuit 17 thus continues to output the X-address AX0–AXn even after the address signal A0–An changes. At the next high-to-low transition of CLK the signal S15 goes high, opening the Y-address input gate 16.

At time t3, following this high-to-low transition of CLK and allowing a certain setup time Tcs with respect to the next low-to-high transition of CLK, the central processing unit drives $\overline{CAS}$ active (low). At about the same time the central processing unit places a Y-address on the address signal lines A0–An. As soon as it becomes valid, this address is passed through the Y-address input gate 16 and the second transparent latch circuit 18 to the Y-address decoder 30 as the Y-address AY0–AYn.

At time t4 CLK goes high, the Y-address latch signal S14 rises, and the second transparent latch circuit 18 closes, thus continuing to output the Y-address AY0–AYn even after the address signals A0–An change.

The address signals A0–An are synchronized with CLK, so by latching the signals at the CLK transitions at t2 and t4 it is easy to ensure that valid addresses are latched. In addition, since $\overline{RAS}$ and $\overline{CAS}$ are not used as latch triggers (as in the prior art), but only to determine the triggering edges of CLK, their timing requirements are relaxed. $\overline{RAS}$ and $\overline{CAS}$ can be driven active even prior to valid address output, as in FIG. 3. High clock rates are thus possible.

Moreover, the use of transparent latch circuits 17 and 18 allows decoding of the X- and Y-addresses to begin even before the latch points at t2 and t4, resulting in an overall shortening of the memory cycle. Similar advantages apply to the latching of $\overline{RAS}$ and $\overline{CAS}$ by the transparent latch circuits 11 and 12, the outputs of which are furnished to other circuits such as data input and output timing circuits not shown in FIG. 2.

The address input circuit 10 in FIG. 1 is not limited to the configuration shown in FIG. 2. For example, the third and fourth transparent latches 11 and 12, the delay line 15, and the Y-address input gate 16 can be omitted if not needed. The internal structure of the X- and Y-address latch signal generating circuits 13 and 14 can be modified. First and second control signals that are active high can be used instead of $\overline{RAS}$ and $\overline{CAS}$. X- and Y-address buffer circuits may be added as output stages following the first and second transparent latch circuits 17 and 18.

Figure 4:
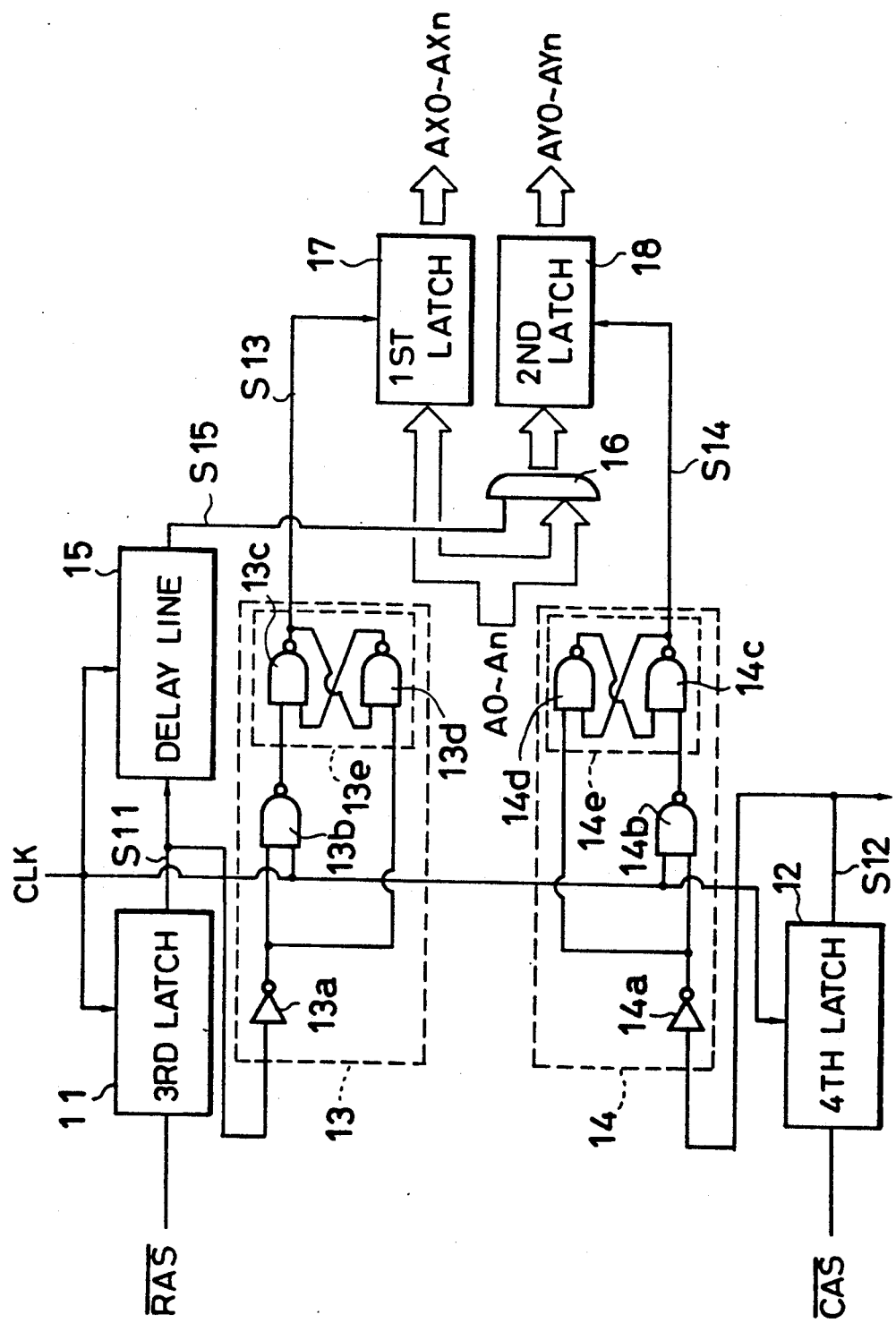
FIG. 4 is a schematic diagram of a modification of the address input circuit of FIG. 2.
Figure 5:
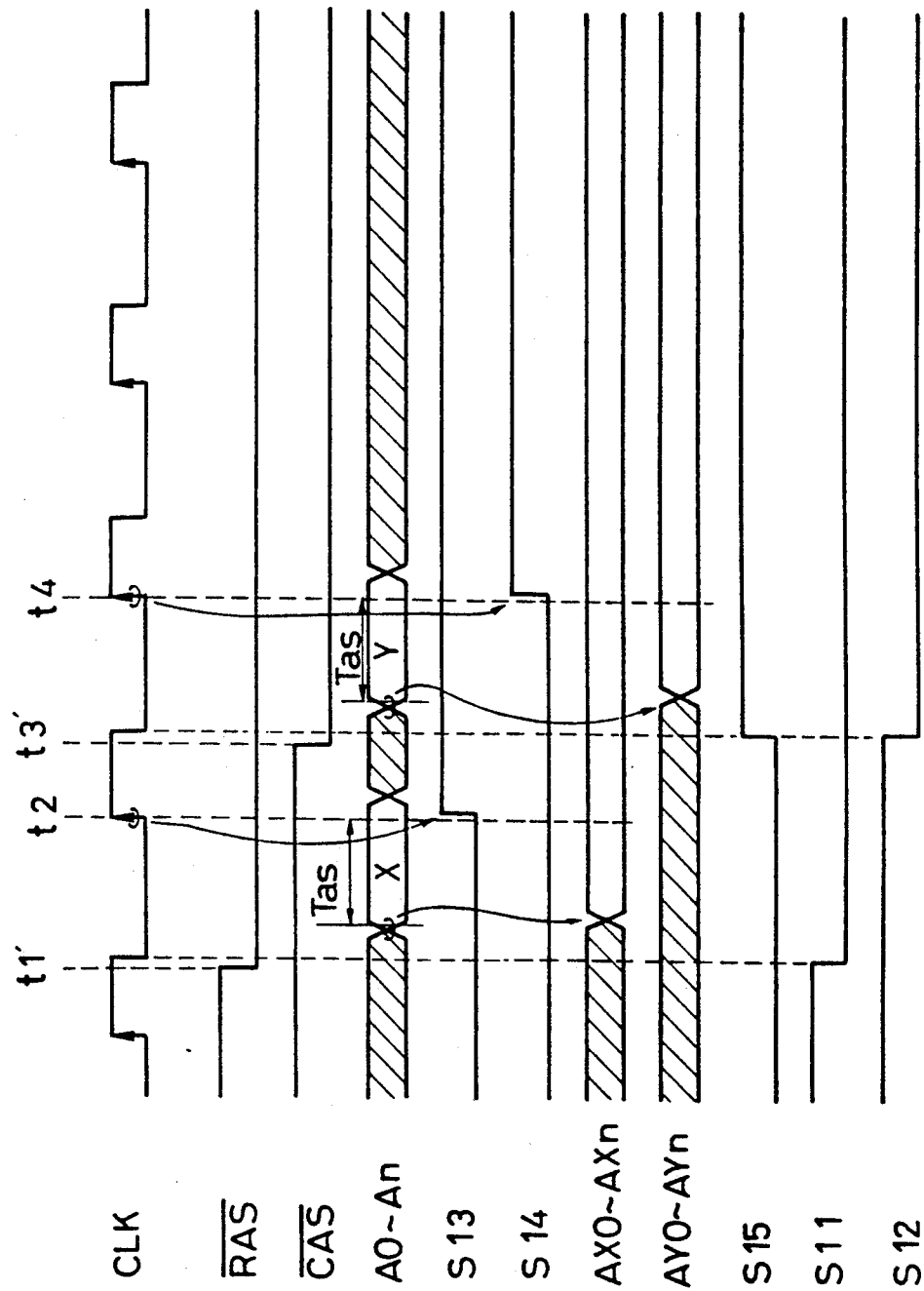
FIG. 5 is a timing diagram for FIG. 4.

A modification of the address input circuit of FIG. 2 is shown in FIG. 4. The address input circuit of FIG. 4 differs from the address input circuit of FIG. 2 in that the input of the X- and Y-address latch signal generating circuits 13 and 14 are connected respectively to the outputs of the third and fourth transparent latch circuits 11 and 12. With this modification, the timing requirements of $\overline{RAS}$ and $\overline{CAS}$ further relaxed, as will be seen from FIG. 5. That is, if the $\overline{RAS}$ goes low at t1′ before high-to-low transition of CLK, the X-address latch signal S13 does not go high until t2 because the output S11 of the third transparent latch circuit 11 goes low at or slightly after (with the propagation delay) the high-to-low transition of CLK. The time at which the X-address is latched is therefore unaffected. Similarly, even if the $\overline{CAS}$ goes low at t3′ before high-to-low transition of CLK, the Y-address latch signal S14 does not go high until t4 because the output S12 of the fourth transparent latch circuit 12 goes low at or slightly after (with the propagation delay) the high-to-low transition of CLK. The time at which the Y-address is latched is therefore unaffected.

The remainder of the detailed description of the invention is concerned with the output section of the data input/output circuit 50 in FIG. 1, and will show several novel means of outputting memory data in synchronization with CLK.

Figure 6:
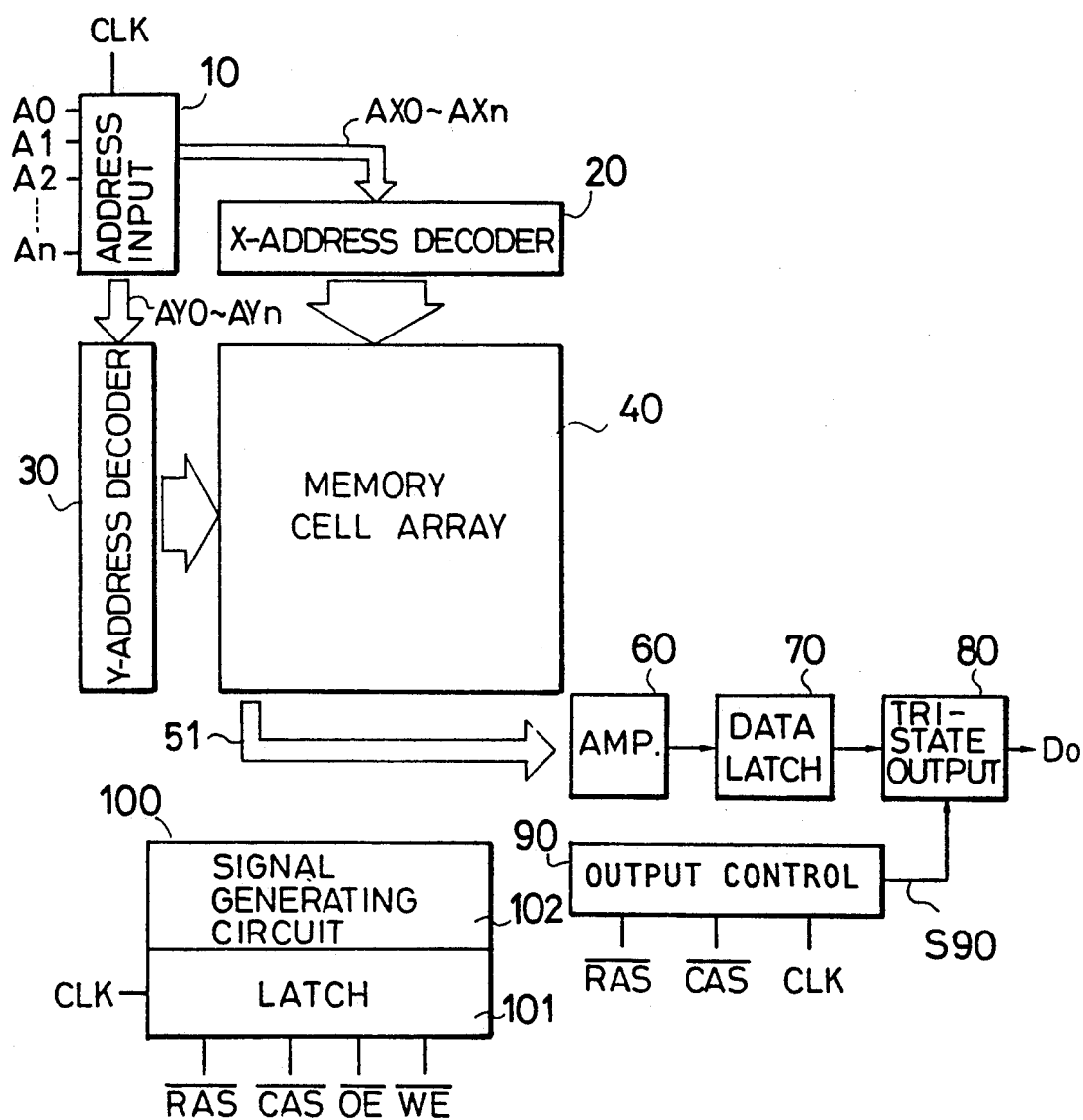
FIG. 6 is a block diagram of a synchronous DRAM with novel output means.

FIG. 6 is a block diagram showing one basic data output scheme. Elements common to FIG. 1 have the same reference numerals. The address input circuit 10 can be the circuit shown in FIG. 2 or a modification thereof as noted above.

Output data from the memory cell array 40 is amplified by sense amplifiers (not explicitly shown) and placed on an internal data bus 51. After further amplification by an amplifier circuit 60, the data is sent to a data latch circuit 70 and held for output. Output takes place through a tri-state output circuit 80 capable of producing high or low output, or placing the output signal line or lines (Do in the drawing) in a high-impedance state. The output circuit is enabled and disabled by an output control signal S90 generated by an output control circuit 90.

Also shown in FIG. 6 is a memory control signal generating circuit 100 comprising a latch circuit 101 and a signal generating circuit 102. The latch circuit 101 receives CLK and external control signals such as $\overline{RAS}$, $\overline{CAS}$, an output enable signal ($\overline{OE}$), and a write enable signal ($\overline{WE}$), and has the general function of latching the control signals and synchronizing the operation of the DRAM with CLK. The latch circuit 101 comprises, for example, circuits similar to those in FIG. 2. (The fourth transparent latch 12 in FIG. 2, which is not explicitly used for address input, can be considered as disposed in the latch circuit 101.) The signal generating circuit 102 receives the outputs of the latch circuit 101 and generates various types of memory control signals, such as a signal selecting read or write mode, which are not explicitly shown but will be familiar to those skilled in the art.

The output control circuit 90 is adapted to drive the output control signal S90 to the active state for one clock cycle, starting a certain number of clocks after $\overline{RAS}$ becomes active: for example, S90 may be active during an interval from substantially the third rising edge of CLK after $\overline{RAS}$ becomes active until substantially the fourth rising edge. In order for S90 to be activated, $\overline{CAS}$ must become active after $\overline{RAS}$ becomes active, but it is not necessary for $\overline{CAS}$ to remain active. The output control circuit 90 can be realized in various ways, one of which is described next.

Figure 7:
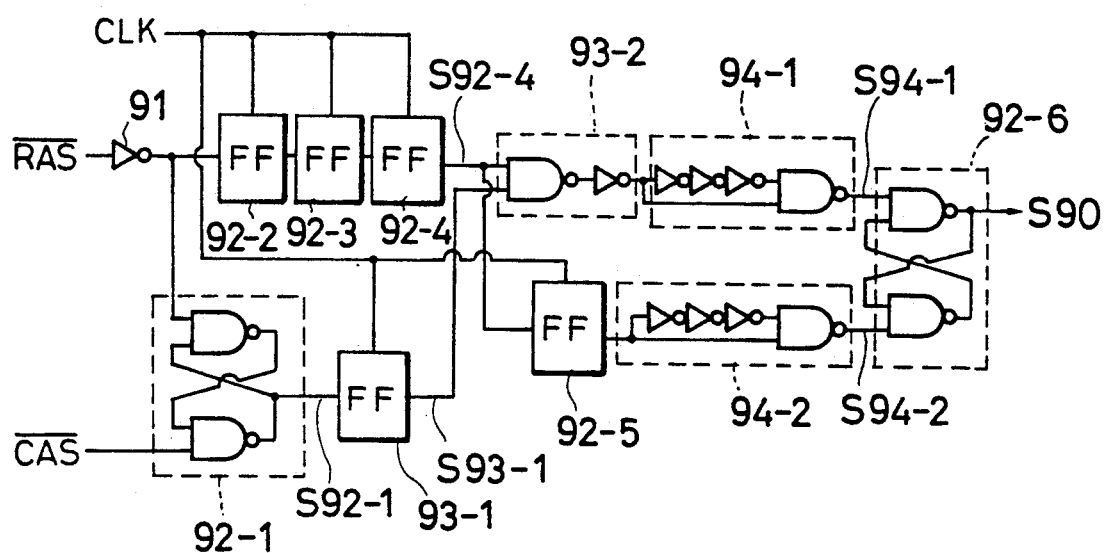
FIG. 7 is a schematic diagram illustrating one configuration of the output control circuit in FIG. 6.

Referring to FIG. 7, the output control circuit 90 comprises an inverter 91 for inverting $\overline{RAS}$, a set-reset flip-flop 92-1 that is set by $\overline{CAS}$ and reset by the output of the inverter 91, and D-type flip-flops 92-2 to 92-5 connected in series and clocked by CLK. The output of the set-reset flip-flop 92-1 is fed to a further D-type flip-flop 93-1, which is also clocked by CLK.

The first flip-flop 92-2 in the series of D-type flip-flops 92-2 to 92-5 receives the inverted $\overline{RAS}$ signal from the inverter 91, and passes this signal to the second flip-flop 92-3. From the second flip-flop 92-3, the signal enters the next-to-last flip-flop 92-4. The output S92-4 of the next-to-last flip-flop 92-4 is fed not only to the last flip-flop 92-5 but also to an AND gate 93-2 comprising a NAND gate followed by an inverter. The other input of the AND gate 93-2 is the output of the further flip-flop 93-1.

The output of the AND gate 93-2 is fed to a one-shot pulse generating circuit 94-1 comprising an odd number of inverters and a NAND gate connected in series. The output of the last flip-flop 92-5 is fed to a similar one-shot pulse generating circuit 94-2. The outputs of the one-shot pulse generating circuits 94-1 and 94-2 are fed as set and reset inputs, respectively, to a set-reset flip-flop 92-6. The output of the set-reset flip-flop 92-6 is the output control signal S90.

The purpose of the set-reset flip-flop 92-1, the further flip-flop 93-1, and the AND gate 93-2 is to ensure that the output control signal S90 does not go high unless $\overline{CAS}$ becomes active (low) beforehand.

The operation of the memory in FIG. 6 and FIG. 7 will be explained with reference to FIG. 8. Address input is carried out as already described: an X-address is latched at the first rising edge of CLK after $\overline{RAS}$ becomes active, at time t11 in FIG. 8; a Y-address is latched at the first rising edge of CLK after $\overline{CAS}$ becomes active, at time t12 in FIG. 8. Decoding of the X- and Y-addresses begins even before t11 and t12, so data output from the memory cell array 40 starts promptly around time t12, permitting the data to be latched in the data latch circuit 70 before the next rising CLK edge at time t13.

Figure 8:
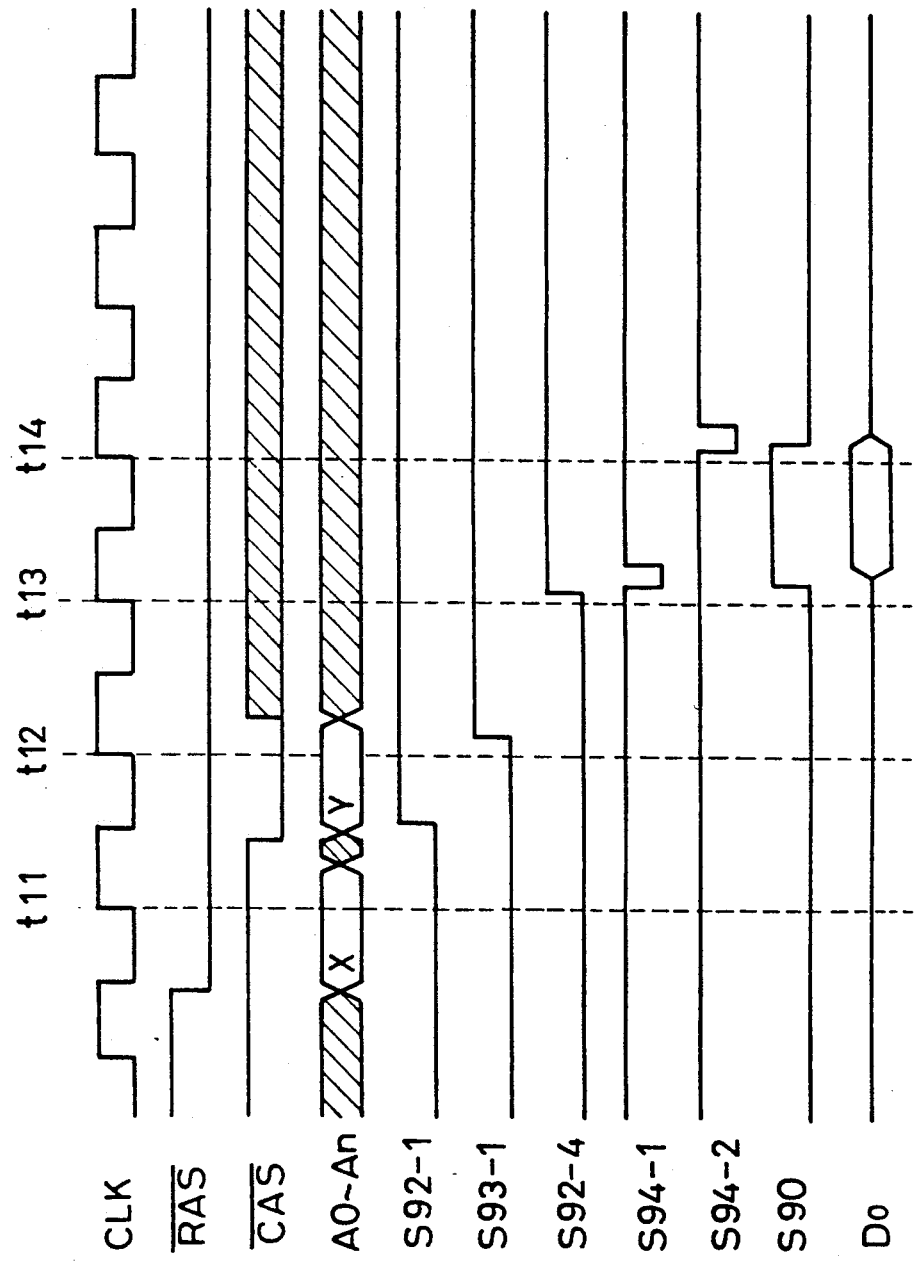
FIG. 8 is a timing diagram for FIG. 6 and FIG. 7.

The lower eight waveforms in FIG. 8 illustrate the operation of the output control circuit 90 and tri-state output circuit 80. When $\overline{CAS}$ goes active (low) between times t11 and t12, the set-reset flip-flop 92-1 sets. The signal S92-1 goes high at this time and remains high regardless of the further behavior of $\overline{CAS}$. The flip-flop 93-1 latches the signal S92-1 at time t12, causing the signal S93-1 to go high at substantially time t12.

The fall of $\overline{RAS}$ before time t11 causes a high signal to be latched in the flip-flop 92-2 at time t11, in the flip-flop 92-3 at time t12, and in the flip-flop 92-4 at time t13. The signal S92-4 thus goes high substantially at time t13. Since S93-1 is already high, the output of the AND gate 93-2 changes from low to high, causing the one-shot pulse generating circuit 94-1 to output a brief low pulse S94-1 that sets the set-reset flip-flop 92-6. The output control signal S90 thus becomes active (high) at substantially time t13.

At time t14 the signal S92-4 is latched in the flip-flop 92-5, the output of which thus changes from low to high, causing the one-shot pulse generating circuit 94-2 to produce a brief low pulse S94-2 that resets the set-reset flip-flop 92-6. The output control signal S90 therefore becomes inactive (low) at substantially time t14.

The tri-state output circuit 80 is normally in the high-impedance state, but when the output control signal S90 is active, the tri-state output circuit 80 is enabled and outputs data Do. Data output thus takes place for one CLK cycle from substantially time t13 to substantially time t14, regardless of the active duration of $\overline{CAS}$. The data can be read at or before time t14.

Although not shown in the drawing, at an appropriate time $\overline{RAS}$ goes high to end the memory cycle. $\overline{RAS}$ can be driven high at any time after time t13, and the low-to-high transition of $\overline{RAS}$ need not be precisely synchronized with the time at which the output data are read.

An advantage of the memory illustrated in FIG. 6 to FIG. 8 is that data output is accurately synchronized to CLK regardless of the precise timing of $\overline{RAS}$ and $\overline{CAS}$. The same is true of the latching of address input. Operation of the memory can thus easily be synchronized with the operation of other circuits disposed, for example, on the same semiconductor chip and driven by the same clock signal CLK.

Figure 9:
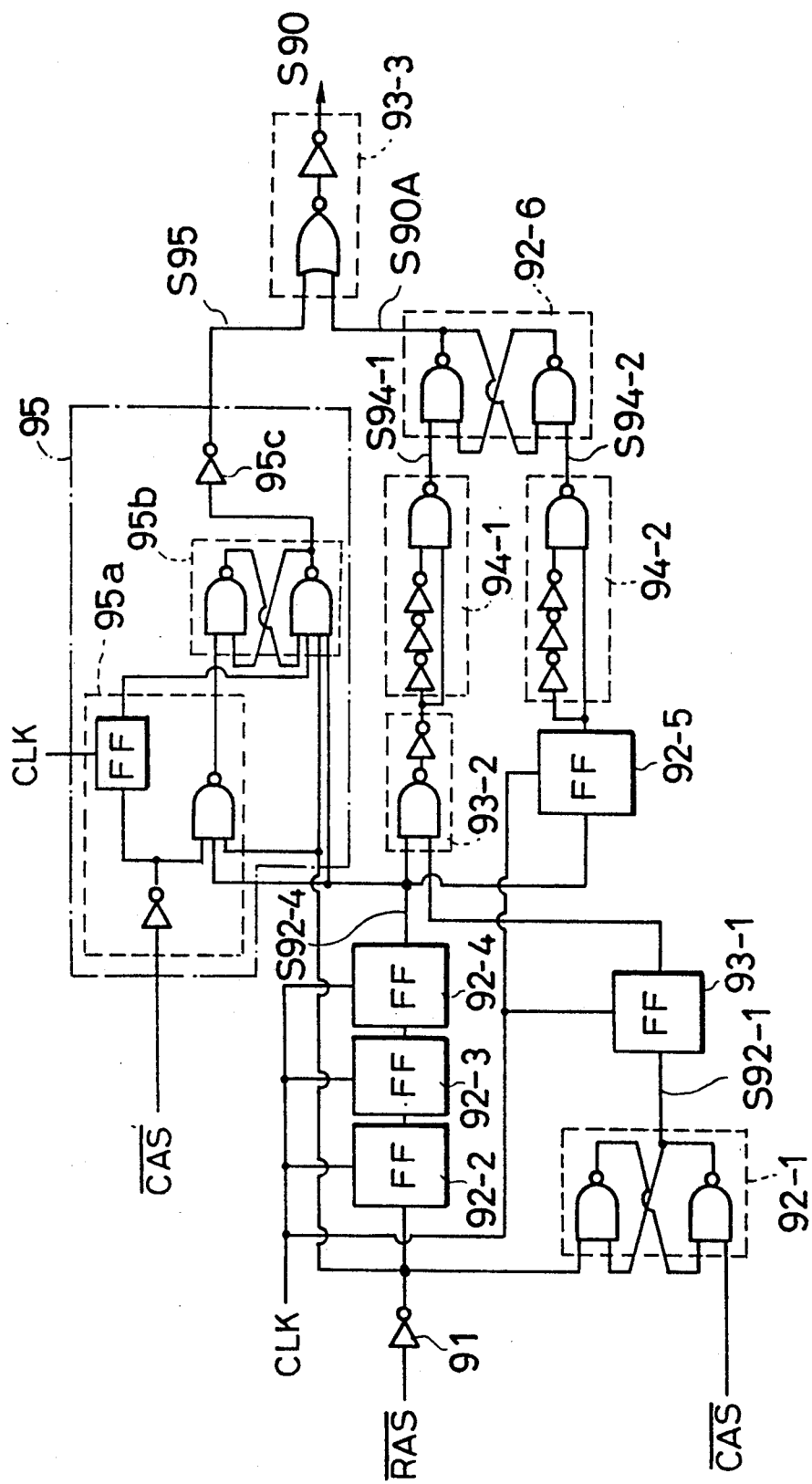
FIG. 9 is a schematic diagram illustrating another configuration of the output control circuit in FIG. 6.

FIG. 9 illustrates another possible configuration of the output control circuit 90. Elements common to FIG. 7 have the same reference numerals, except that the output of the set-reset flip-flop 92-6 is denoted S90A.

FIG. 9 is identical to FIG. 7 except for the addition of an OR gate 93-3 and an output extending circuit 95. The output extending circuit 95 receives CLK, $\overline{CAS}$, S92-4, and the output of the inverter 91 and produces an output extending signal S95. The OR gate 93-3, which comprises a NOR gate followed by an inverter, combines the signal S90A with the signal S95 by OR logic to produce the output control signal S90 sent to the tri-state output circuit 80 in FIG. 6.

The output extending circuit 95 comprises a logic circuit 95a, a set-reset flip-flop 95b, and an inverter 95c. The logic circuit 95a comprises logic gates and a flip-flop (FF) that is triggered on rising edges of CLK. It can readily be verified from FIG. 9 that the set-reset flip-flop 95b resets, driving the signal S95 high, when $\overline{CAS}$ and $\overline{RAS}$ are both low and S92-4 is high, and sets, driving the signal S95 low, when $\overline{CAS}$ is high and CLK goes high, or when $\overline{RAS}$ is high, or when S92-4 is low.

Figure 10:
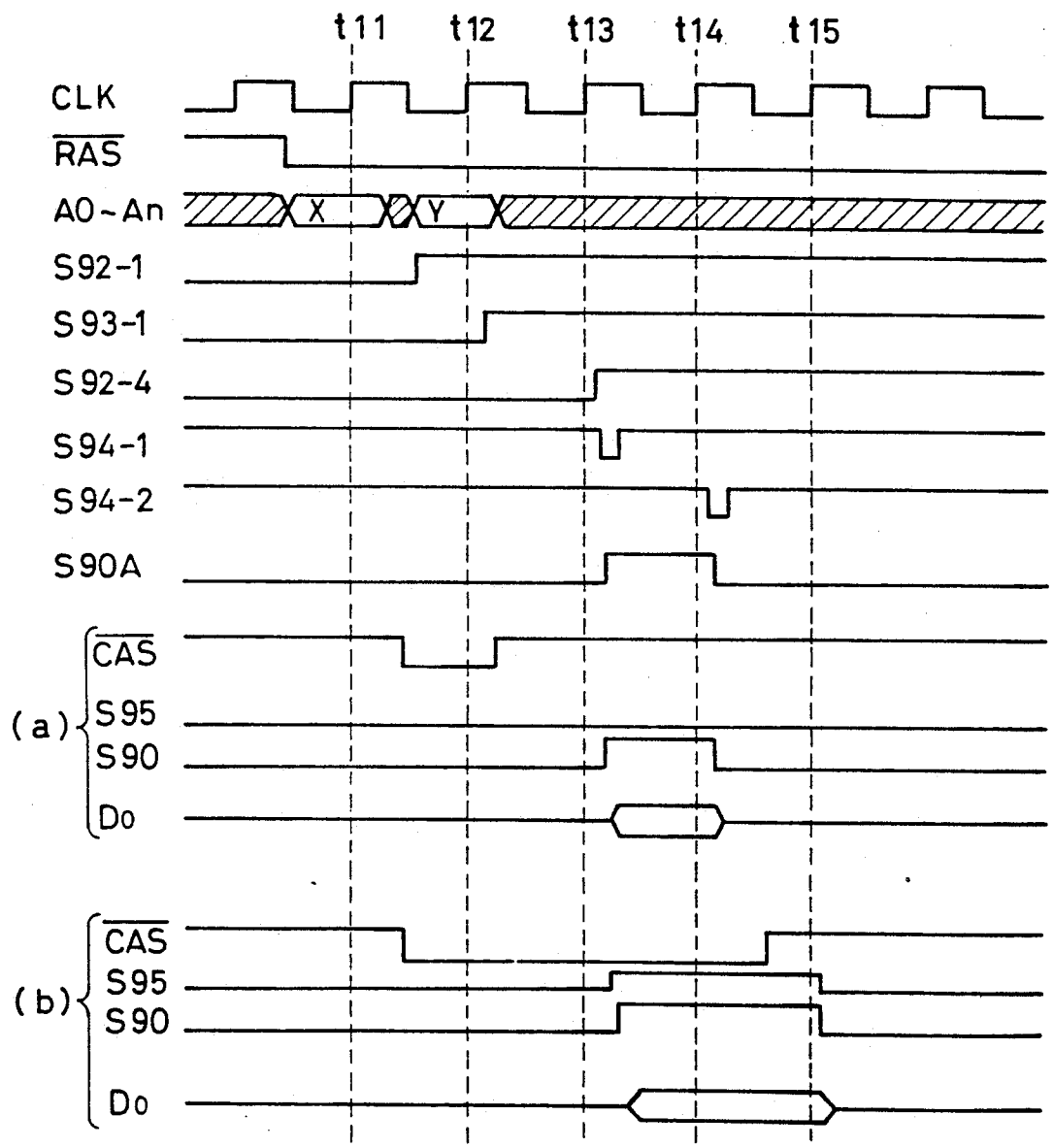
FIG. 10 is a timing diagram for FIG. 6 and FIG. 9.

The operation of the output control circuit in FIG. 9 will be explained with reference to the timing diagram in FIG. 10, which illustrates two cases: a first case (a) in which $\overline{CAS}$ goes high before the output cycle begins at time t13, and a second case (b) in which $\overline{CAS}$ goes high after time t13.

In case (a), the signal S95 output by the output extending circuit 95 remains low throughout the memory cycle, because S92-4 never becomes high while $\overline{CAS}$ is low. The operation is thus the same as in FIG. 8: data Do are output for one CLK cycle from substantially time t13 to substantially time t14.

In case (b), $\overline{CAS}$ is still active (low) when S92-4 goes high at time t13, so the signal S95 becomes active (high) at this time. S95 remains active until t15, the first rising edge of CLK after $\overline{CAS}$ becomes inactive (high). The high input of S95 to the OR gate 93-3 in FIG. 9 extends the active (high) interval of the output control signal S90 until time t15. Data output thus continues for two CLK cycles from substantially time t13 to substantially time t15. The data can be read, for example, on the first rising edge of CLK after $\overline{CAS}$ becomes inactive.

The output control circuit in FIG. 9 provides the same advantages as the output control circuit in FIG. 7, output being accurately synchronized to CLK regardless of the precise timing of $\overline{CAS}$ and $\overline{RAS}$. A further advantage is that by holding $\overline{CAS}$ low, the central processing unit can prolong data output until it becomes convenient to read the data.

Figure 11:
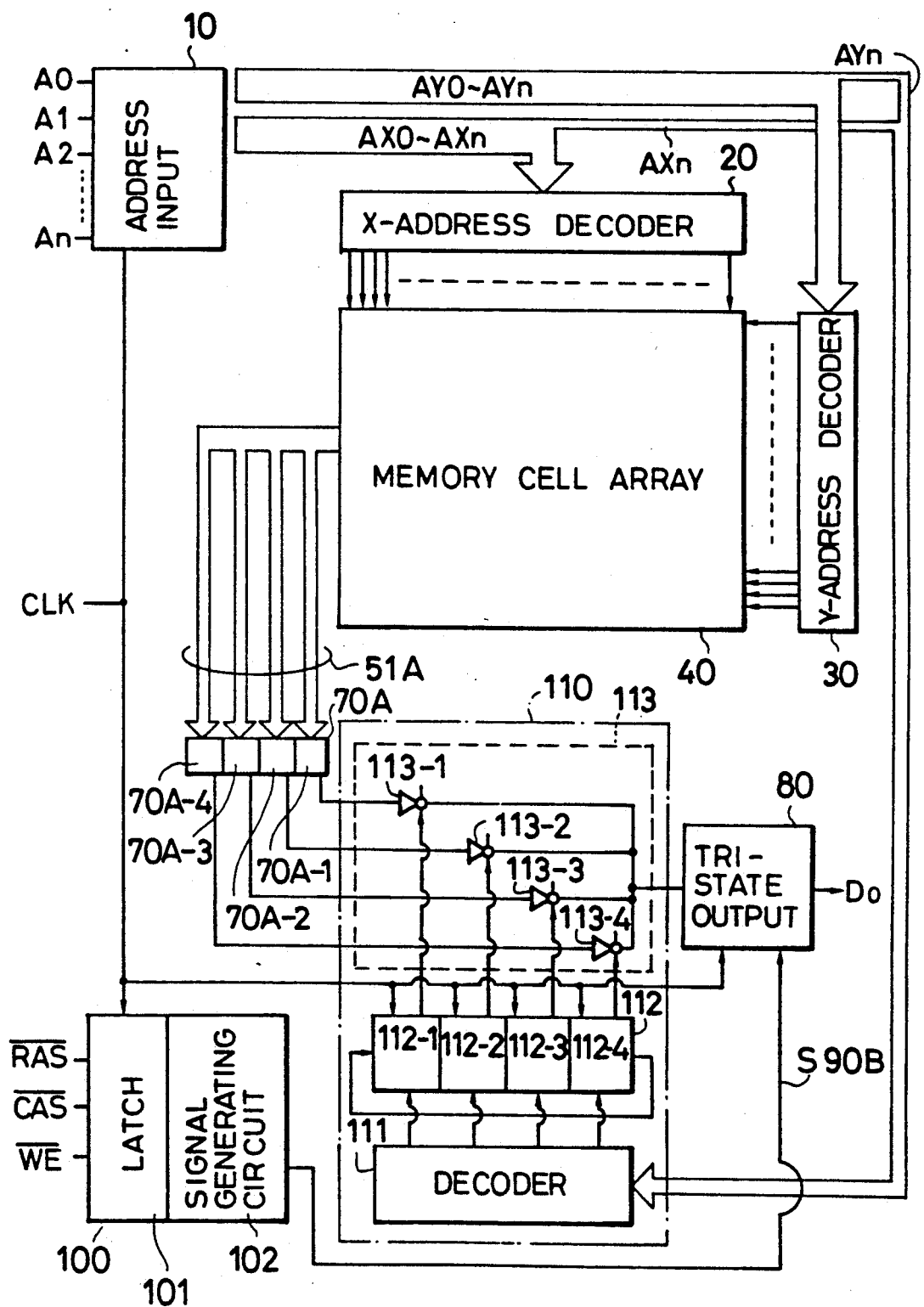
FIG. 11 is a block diagram of a synchronous DRAM with another novel output means.

FIG. 11 is a block diagram of a novel memory generally similar to the one in FIG. 6 but adapted for nibble-mode output. Elements common to FIG. 6 have the same reference numerals. Descriptions of the address input circuits will be omitted.

The nibble output mode is a mode in which input of a single pair of X- and Y-addresses causes output in four consecutive clock cycles of data from, for example, memory cells in four different quadrants of the memory cell array. If the width of the output data Do is one bit, this operation causes one nibble (four bits) to be output in four clock cycles. For simplicity, the subsequent description will be confined to this case, but the invention is not limited to output of one bit at a time. The width of the output data Do may be eight bits, for example, in which case thirty-two bits are output in four clock cycles, eight bits at a time. Neither is the invention limited to just four clock cycles; the same inventive concept can be used to obtain data output in any desired number of consecutive clock cycles.

The memory in FIG. 11 has a data bus group 51A comprising four data buses, each similar to the data bus 51 in FIG. 6. These carry data from separate memory cells in the memory cell array 40 to a multiple latch circuit 70A comprising, in this case, four one-bit latch circuits 70A-1 to 70A-4. The outputs from the multiple latch circuit 70A are sent to a consecutive output control circuit 110.

The consecutive output control circuit 110 comprises a decoder 111, a shift register 112, and an output select circuit 113. The decoder 111 receives certain bits of the X-address AX0–AXn and the Y-address AY0–AYn from the address input circuit 10, such as the most significant address bits AXn and AYn, decodes these bits, and sends four resulting signals to the shift register 112.

For any input to the decoder 111, just one of the signals output from the decoder is active, the others being inactive. Provided this condition is met, the invention is not limited to any particular decoding scheme. Nor is the invention limited to the use of the most significant address bits; the decoder 111 can decode any address bit or set of address bits as required by the application.

The shift register 112 is well-known device that stores the outputs of the decoder 111 in four bit storage cells 112-1 to 112-4, and rotates the contents of these bit storage cells 112-1 to 112-4 in synchronization with the clock signal CLK. The rotation is from left to right, the contents of the last bit storage cell 112-4 being shifted into the first bit storage cell 112-1. The contents of the bit storage cells 112-1 to 112-4 are sent as outputs from the shift register 112 to the output select circuit 113.

The output select circuit 113 comprises switches 113-1 to 113-4 that turn on and off in response to the outputs of the shift register. These switches connect the outputs of the one-bit latch circuits 70A-1 to 70A-4 to the tri-state output circuit 80.

A circuit generally analogous to the output control circuit 90 in FIG. 6, but with additional D-type flip-flops following the flip-flop 92-5, is incorporated into the signal-generating circuit 102 in FIG. 11. Using this circuit, the signal-generating circuit 102 generates a signal S90B that enables the tri-state output circuit 80 for four consecutive CLK cycles starting, for example, with the second cycle after $\overline{RAS}$ becomes active.

The operation of the memory in FIG. 11 will be explained with reference to FIG. 12. As before, the X-address is latched at the first rising edge of CLK after the fall of $\overline{RAS}$ (time t21) and the Y-address is latched at the first rising edge of CLK after the fall of $\overline{CAS}$ (time t22). The decoder 111 decodes the most significant address bits AXn and AYn. At time t22 the four decoded signals from the decoder 111 are stored in the shift register 112. Also at time t22, four bits of data D1, D2, D3, and D4 are sent from the memory cell array 40 via the data bus group 51A to the multiple data latch circuit 70A, and stored in the one-bit latch circuits 70A-1 to 70A-4.

Since just one of the four decoded signals from the decoder 111 is active, a logic "1" is stored in just one of the four bit storage cells 112-1 to 112-4. Suppose, for example, that a logic "1" is stored in the bit storage cell 112-1 and a logic "0" in the bit storage cells 112-2 to 112-4. Then the switch 113-1 turns on while the switches 113-2 to 113-4 are off, and during the interval from substantially time t22 to time t23 the bit D1 stored in the one-bit latch circuit 70A-1 is sent to the tri-state output circuit 80 and output as the output data Do.

When the clock signal CLK rises at time t23 the logic "1" is shifted from the bit storage cell 112-1 to the bit storage cell 112-2, causing the switch 113-1 to turn off and the switch 113-2 to turn on. During the interval from substantially time t23 to time t24 the bit D2 stored in the one-bit latch circuit 70A-2 is sent to the tri-state output circuit 80 and output as the output data Do.

Similarly, at time t24 the logic "1" is shifted from the bit storage cell 112-2 to the bit storage cell 112-3 and the bit D3 stored in the one-bit latch circuit 70A-3 is output as the output data Do. At time t25 the logic "1" is shifted from the bit storage cell 112-3 to the bit storage cell 112-4 and the bit D4 stored in the one-bit latch circuit 70A-4 is output as the output data Do.

Figure 12:
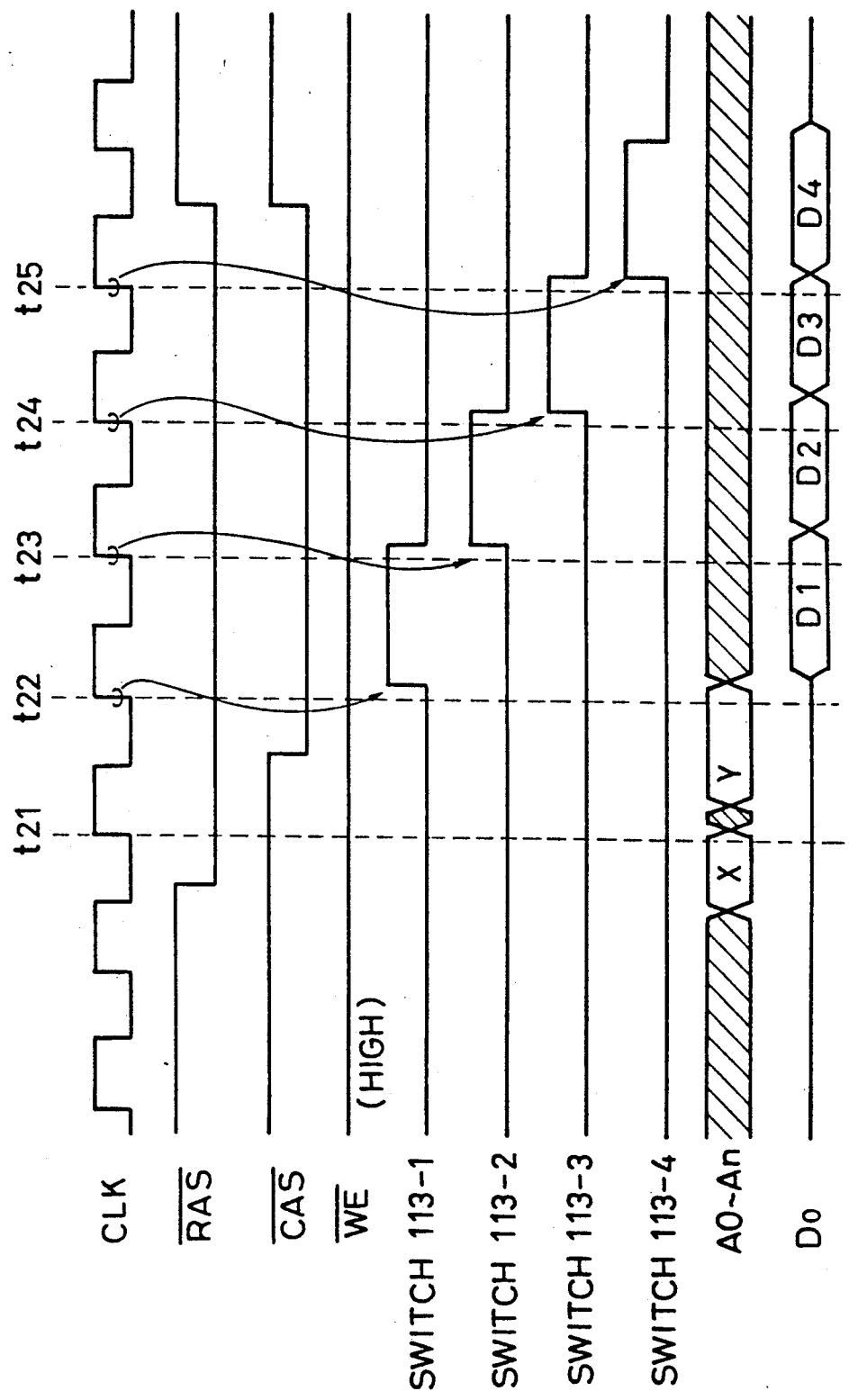
FIG. 12 is a timing diagram for FIG. 11.

An advantage of the memory described in FIG. 11 and FIG. 12 is that nibble-mode output is obtained at the rate of one bit per clock cycle. In the prior art, nibble-mode output was obtained by toggling $\overline{CAS}$. If transitions of $\overline{CAS}$ are synchronized with, say, the falling edge of CLK, then two CLK cycles are needed to produce one cycle of $\overline{CAS}$, so data can be output at only half the rate shown in FIG. 12.

Figure 13:
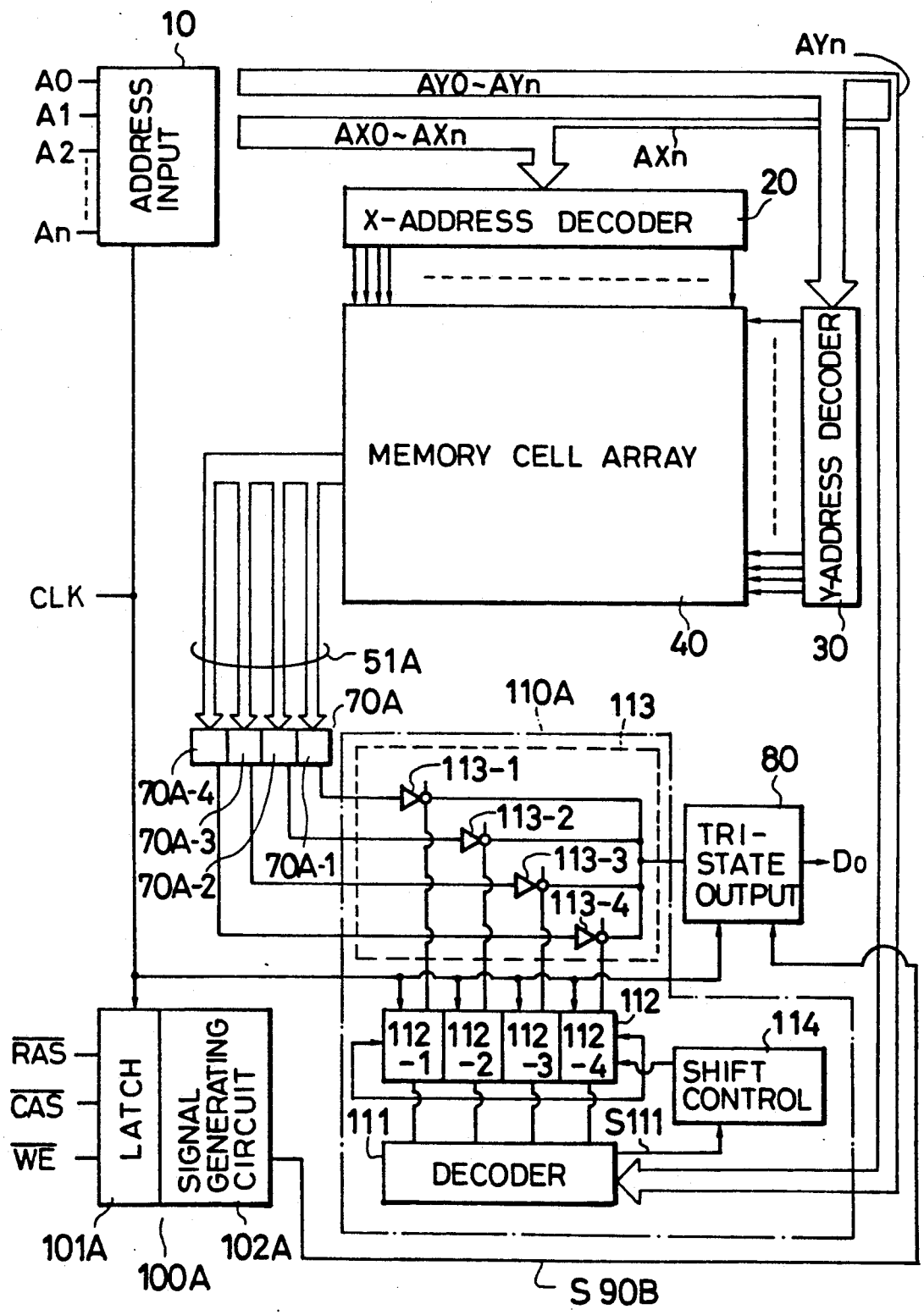
FIG. 13 is a block diagram of a synchronous DRAM with yet another novel output means.

FIG. 13 shows a modification of the memory in FIG. 11. Elements common to FIG. 11 have the same reference numerals.

The new element in FIG. 13 is a shift control circuit 114 that receives a shift control signal S111 from the decoder 111 and sends a corresponding signal to the shift register 112 to control the shift direction. When the shift control signal S111 is high, for example, the shift register 112 rotates from left to right, but when the shift control signal S111 is low the shift register 112 rotates from right to left. The decoder generates S111 by decoding the most significant address bits AXn and AYn.

The operation of the memory in FIG. 13 will be described with reference to FIG. 14 and FIG. 15.

Referring to FIG. 14, suppose that the most significant address bits AXn and AYn are decoded as in FIG. 12 so that the bit D1 stored in the one-bit latch circuit 70A-1 is output first, and suppose further that for this value of AXn and AYn, the shift control signal S111 is high. Then the output operation is identical to FIG. 12, data being output in the order D1, D2, D3, D4.

Referring to FIG. 15, suppose that the most significant address bits AXn and AYn have different values, causing the bit D2 stored in the one-bit latch circuit 70A-2 to be output first and the shift control signal S111 to be held low. Then the order of output is D2, D1, D4, D3.

In some microcontroller designs it is convenient for the central processing unit to be able to receive nibble data in either the forward or reverse order, depending on the starting bit. The memory in FIG. 13 can easily be interfaced to such a central processing unit. The central processing unit can operate faster than in the prior art because it does not have to rearrange the data received from the memory.

The memories in FIG. 6, FIG. 11, and FIG. 13 also have circuits for writing and refreshing data in the memory cell array 40. These circuits are well known and for the sake of simplicity and clarity were omitted from the drawings.

The structures of the output control circuits in FIG. 7 and FIG. 9 and the consecutive output control circuits in FIG. 11 and FIG. 13 can be modified in various ways, and these circuits can be combined to provide, for example, both single-bit and nibble output modes in the same memory. These and other changes can be made without departing from the spirit and scope of the present invention, which should be determined solely from the appended claims.

What is claimed is:

1. A synchronous dynamic random-access memory that provides data output in response to multiplexed address signals, a first control signal, a second control signal, and a clock signal, comprising:

a memory cell array having a plurality of memory cells;

address input means for latching said address signals on a first transition of said clock signal selected by said first control signal to generate an X-address, and on a second transition of said clock signal selected by said second control signal to generate a Y-address;

decoding means coupled to said memory cell array and said address input means, for selecting one or more memory cells in said memory cell array according to said X-address and said Y-address; and output means coupled to said memory cell array, for outputting data from said memory cells in synchronization with said clock signal;

wherein said address input means comprises:

X-address latch signal generating means for generating an X-address latch signal that becomes active when said clock signal undergoes a certain transition while said first control signal is active, and remains active until said first control signal becomes inactive;

Y-address latch signal generating means for generating a Y-address latch signal that becomes active when said clock signal undergoes a certain transition while said second control signal is active, and remains active until said second control signal becomes inactive;

first transparent latch means, for latching said address signal in response to said X-address latch signal; and second transparent latch means, for latching said address signal in response to said Y-address latch signal.

2. The memory of claim 1, wherein said X-address latch signal generating means comprises:
a first set-reset flip-flop circuit;
an first inverter for inverting said first control signal to generate a first inverted signal that resets said first set-reset flip-flop circuit; and
a first logic gate circuit for combining the clock signal and the first inverted signal to generate a signal that sets said first set-reset flip-flop circuit.

3. The memory of claim 1, wherein said Y-address latch signal generating means comprises:
a second set-reset flip-flop circuit;
a second inverter for inverting said second control signal to generate a second inverted signal that resets said second set-reset flip-flop circuit; and
a second logic gate circuit for combining the clock signal and the second inverted signal to generate a signal that sets said second set-reset flip-flop circuit.

4. The memory of claim 1, also comprising:
third transparent latch means for latching said first control signal in response to said clock signal; and
fourth transparent latch means for latching said second control signal in response to said clock signal.

5. The memory of claim 4, further comprising:
delay means coupled to said third transparent latch means, for delaying output of said third latch circuit responsive to said clock signal; and
gating means coupled to said second transparent latch means, for gating address input to said second transparent latch means responsive to output of said delay means.

6. A synchronous dynamic random-access memory that provides data output in response to multiplexed address signals, a first control signal, a second control signal, and a clock signal, comprising:
a memory cell array having a plurality of memory cells;
address input means for latching said address signals on a first transition of said clock signal selected by said first control signal to generate an X-address, and on a second transition of said clock signal selected by said second control signal to generate a Y-address;
decoding means coupled to said memory cell array and said address input means, for selecting one or more memory cells in said memory cell array according to said X-address and said Y-address; and
output means coupled to said memory cell array, for outputting data from said memory cells in synchronization with said clock signal;
wherein said output means comprises:
data latch means for latching data read from said memory cells;
output control means for generating an output control signal that becomes active for one cycle of said clock signal, starting a certain number of cycles of said clock signal after a cycle of said clock signal in which said first control signal becomes active; and
tri-state output means, enabled and disabled by said output control signal, for external output of data held in said data latch means.

7. The memory of claim 6, wherein said output control signal becomes active only if said second control signal becomes active after said first control signal becomes active.

8. The memory of claim 6, wherein said output control signal remains active for just one clock cycle.

9. The memory of claim 6, wherein said output control signal remains active for just one clock cycle if said second control signal becomes inactive before or during this clock cycle, but otherwise remains active for further clock cycles until said second control signal has become inactive.

10. The memory of claim 6, wherein said output control means comprises:
a series of flip-flop means clocked by said clock signal, for delaying said first control signal;
first one-shot pulse generating means, coupled to receive output of a next-to-last flip-flop means in said series, for generating a first pulse signal in response thereto;
second one-shot pulse generating means, coupled to receive output of a last flip-flop means in said series, for generating a second pulse signal in response thereto; and
first set-reset flip-flop means set by said first pulse signal and reset by said second pulse signal.

11. The memory of claim 10, wherein said output control means also comprises:
second set-reset flip-flop means set by said second control signal and reset by said first control signal;
further flip-flop means, clocked by said clock signal, for latching output of said second set-reset flip-flop means; and
gating means for gating output of said next-to-last flip-flop means by output of said further flip-flop means.

12. The memory of claim 10, wherein said output control means also comprises:
output extending means for generating an output extending signal that becomes active when said first control signal is active, said second control signal is active, and output of said next-to-last flip-flop is active, and becomes inactive if a certain transition of said clock signal occurs when said second control signal is inactive; and
OR logic means for modifying said output control signal according to said output extending signal, thereby causing said output control signal to remain active while said output extending signal is active.

13. A synchronous dynamic random-access memory that provides data output in response to first and second address signals, first and second control signals and a clock signal comprising:
a memory cell array having a plurality of memory cells each of which stores predetermined data;
a first latch signal output circuit for outputting a first latch signal in response to said clock signal and said first control signal;
a second latch signal output circuit for outputting a second latch signal in response to said clock signal and said second control signal;
a first latch circuit coupled to said first latch signal output circuit for latching said first address signal in response to the first latch signal;
a second latch circuit coupled to said second latch signal output circuit for latching said second address signal in response to the second latch signal;
a decoding circuit coupled to said memory cell array and said first and second latch circuits for selecting one of the memory cells in said memory cell array in response to said first and second address signals each of which is latched by said first and second latch circuits; and an output circuit coupled to said memory cell array for outputting the data stored in the memory cell which is selected by said first and second address signals in response to said clock signal and said first and second control signals.

14. A synchronous dynamic random access memory according to claim 13, wherein said first latch signal output circuit comprises:

a first set-reset flip-flop circuit;

a first inverter for outputting a first inverted signal which resets said first set-reset flip-flop circuit; and a first logic gate coupled to said first set-reset flip-flop circuit and said first inverter for outputting a first gate signal which sets said first set-reset flip-flop circuit in response to said clock signal and the first inverted signal.

15. A synchronous dynamic random access memory according to claim 13, wherein said second latch signal output circuit comprises;

a second set-rest flip-flop circuit;

a second inverter for outputting a second inverted signal which resets said second set-reset flip-flop circuit; and a second logic gate coupled to said second set-reset flip-flop circuit and said second inverter for outputting a second gate signal which sets said second set-reset flip-flop circuit in response to said clock signal and the second inverted signal.

16. A synchronous dynamic random access memory according to claim 13, further comprising:

a third latch circuit for latching said first control signal in response to said clock signal; and a fourth latch circuit for latching said second control signal in response to said clock signal.

17. A synchronous dynamic random access memory according to claim 16, further comprising:

a delay circuit coupled to said third latch circuit for delaying the first control signal latched by said third latch circuit in response to said clock signal; and a third logic gate coupled to said delay circuit and said second latch circuit for transferring said second address signal to said second latch circuit in response to the first control signal delayed by said delay circuit.

18. A synchronous dynamic random access memory according to claim 13, wherein said output circuit comprises:

an output control circuit for outputting an output control signal in response to said clock signal and said first and second control signals;

a data output circuit coupled to said output control circuit for outputting the data stored in the memory cell which is selected by said first and second address signals in response to the output control signal.

19. A synchronous dynamic random access memory according to claim 18, wherein the output control signal becomes active only if said second control signal becomes active after said first control signal becomes active.

20. A synchronous dynamic random access memory according to claim 18, wherein the output control signal remains active for just one clock cycle.

21. A synchronous dynamic random access memory according to claim 19, wherein said output control circuit comprises:

a series of flip-flop circuits for delaying said first control signal in response to said clock signal;

a first one-shot pulse output circuit coupled to said series of flip-flop circuits for outputting a first one-shot pulse signal in response to said first control signal delayed by said series of flip-flop circuits;

a second one-shot pulse output circuit coupled to said series of flip-flop circuits for outputting a second one-shot pulse signal in response to said first control signal delayed by said series of flip-flop circuits; and a third set-reset flip-flop circuit coupled to said first and second one-shot pulse output circuits, the third set-reset flip-flop circuit set by the first one-shot pulse signal and reset by the second one-shot pulse signal.

22. A synchronous dynamic random access memory which is controlled by a clock signal and first and second control signals, comprising:

a clock node for receiving said clock signal, said clock signal having a plurality of transition edges in a predetermined cycle;

a first node for receiving said first control signal, said first control signal having an active state and an inactive state;

a second node for receiving said second control signal, said second control signal having an active state and an inactive state;

a first signal output circuit, coupled to said clock node and said first node, for outputting a first signal in response to a first edge of the clock signal after the first control signal changes from the inactive state to the active state;

a second signal output circuit, coupled to said clock node and said second node, for outputting a second signal in response to a second edge of the clock signal after the second control signal changes from the inactive state to the active state; and an output control circuit, coupled to said clock node, said first signal output circuit and said second signal output circuit, for outputting an output control signal in response to the first and second signals.

23. A synchronous dynamic random access memory according to claim 22, wherein said first signal output circuit includes a flip-flop circuit controlled by the clock signal.

24. A synchronous dynamic random access memory according to claim 22, wherein said second signal output circuit includes a flip-flop circuit controlled by the clock signal.

25. A synchronous dynamic random access memory according to claim 22, wherein said output control circuit includes:

a third signal output circuit coupled to said first and second signal output circuits for outputting a third signal in response to the first and second signals; and a fourth signal output circuit coupled to said third signal output circuit for outputting the output control signal in response to the third signal.

* * * * *